US011342381B2

(12) United States Patent
Yano (10) Patent No.: US 11,342,381 B2
(45) Date of Patent: May 24, 2022

(54) RESISTIVE RANDOM-ACCESS MEMORY DEVICE

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/124,457

(22) Filed: Dec. 16, 2020

(65) Prior Publication Data

US 2021/0210555 A1    Jul. 8, 2021

(30) Foreign Application Priority Data

Jan. 6, 2020   (JP) .............................. JP2020-000217

(51) Int. Cl.
*G11C 13/00*    (2006.01)
*H01L 27/24*    (2006.01)
*H01L 45/00*    (2006.01)

(52) U.S. Cl.
CPC ........ *H01L 27/2436* (2013.01); *G11C 13/004* (2013.01); *G11C 13/0026* (2013.01);
(Continued)

(58) Field of Classification Search
CPC ............... H01L 27/2436; H01L 27/249; H01L 45/1206; H01L 45/1233; H01L 45/1253; H01L 45/145; H01L 45/16; H01L 45/04; H01L 45/1226; H01L 45/146; H01L 27/2481; H01L 45/12; H01L 45/122; G11C 13/0026; G11C 13/0028; G11C 13/004;
(Continued)

(56) References Cited

U.S. PATENT DOCUMENTS 4,974,060 A * 11/1990 Ogasawara ....... H01L 27/10841
257/296
8,547,720 B2   10/2013 Samachisa et al.
(Continued)

FOREIGN PATENT DOCUMENTS

CN       100411179      8/2008
TW       I660463        5/2019

OTHER PUBLICATIONS

Office Action of Taiwan Counterpart Application, dated Jul. 7, 2021, pp. 1-8.

*Primary Examiner* — Michael T Tran
(74) *Attorney, Agent, or Firm* — JCIPRNET (57) ABSTRACT

Provided is a resistive random-access memory device, including: multiple pillars, extending in a vertical direction with respect to a main surface of a substrate; multiple bit lines, extending in a horizontal direction with respect to the main surface of the substrate; and a memory cell, formed at an intersection of the pillars and the bit lines. The memory cell includes a gate insulating film formed on an outer periphery of the pillars, a semiconductor film formed on an outer periphery of the gate insulating film and providing a channel region, and a variable resistance element formed on a part of an outer periphery of the semiconductor film. An electrode region of an outer periphery of the variable resistance element is connected to one of a pair of adjacent bit lines, and the semiconductor film is connected to the other of the pair of adjacent bit lines.

17 Claims, 11 Drawing Sheets

(52) U.S. Cl.
CPC ...... *G11C 13/0028* (2013.01); *G11C 13/0069* (2013.01); *H01L 27/249* (2013.01); *H01L 45/1206* (2013.01); *H01L 45/1233* (2013.01); *H01L 45/1253* (2013.01); *H01L 45/145* (2013.01); *H01L 45/16* (2013.01)

(58) Field of Classification Search
CPC ............ G11C 13/0069; G11C 2213/18; G11C 2213/52; G11C 2213/71; G11C 2213/79; G11C 13/003
USPC .................................................. 365/148, 158
See application file for complete search history.

(56) References Cited

U.S. PATENT DOCUMENTS

| | | | |
|---|---|---|---|
| 9,054,308 B1 * | 6/2015 | Zhang | H01L 27/249 |
| 9,853,053 B2 * | 12/2017 | Lupino | H01L 27/2481 |
| 10,157,909 B2 * | 12/2018 | Or-Bach | H01L 29/66787 |
| 10,224,279 B2 * | 3/2019 | Or-Bach | H01L 45/085 |
| 10,354,995 B2 * | 7/2019 | Or-Bach | H01L 23/367 |
| 10,388,863 B2 * | 8/2019 | Or-Bach | H01L 21/76254 |
| 10,600,657 B2 * | 3/2020 | Or-Bach | H01L 25/50 |
| 10,700,129 B2 * | 6/2020 | Ando | H01L 45/146 |
| 11,157,805 B2 * | 10/2021 | Yajima | G06N 3/063 |
| 2010/0270529 A1 * | 10/2010 | Lung | G11C 13/0023 257/4 |
| 2013/0234095 A1 * | 9/2013 | Baba | H01L 45/1675 257/4 |
| 2013/0328005 A1 | 12/2013 | Shin et al. | |
| 2017/0271007 A1 * | 9/2017 | Suzuki | G11C 13/0064 |
| 2017/0330916 A1 | 11/2017 | Hong et al. | |
| 2018/0218775 A1 * | 8/2018 | Kim | G11C 16/16 |
| 2019/0221277 A1 * | 7/2019 | Reznicek | H01L 45/04 |
| 2019/0348465 A1 * | 11/2019 | Ando | H01L 45/04 |
| 2020/0013791 A1 * | 1/2020 | Or-Bach | H01L 29/42332 |
| 2020/0013800 A1 * | 1/2020 | Or-Bach | H01L 27/2481 |
| 2020/0194668 A1 * | 6/2020 | Sato | H01L 45/1616 |
| 2021/0217473 A1 * | 7/2021 | Cho | G06N 3/04 |

* cited by examiner

RESISTIVE RANDOM-ACCESS MEMORY DEVICE

CROSS-REFERENCE TO RELATED APPLICATION

This application claims the priority benefit of Japan application serial no. 2020-000217, filed on Jan. 6, 2020. The entirety of the above-mentioned patent application is hereby incorporated by reference herein and made a part of this specification.

BACKGROUND

Technical Field

The disclosure relates to a resistive random-access memory device using a resistive random-access memory cell, particularly to a three-dimensional structure of an array including a resistive random-access memory cell.

Description of Related Art

Figure 1:
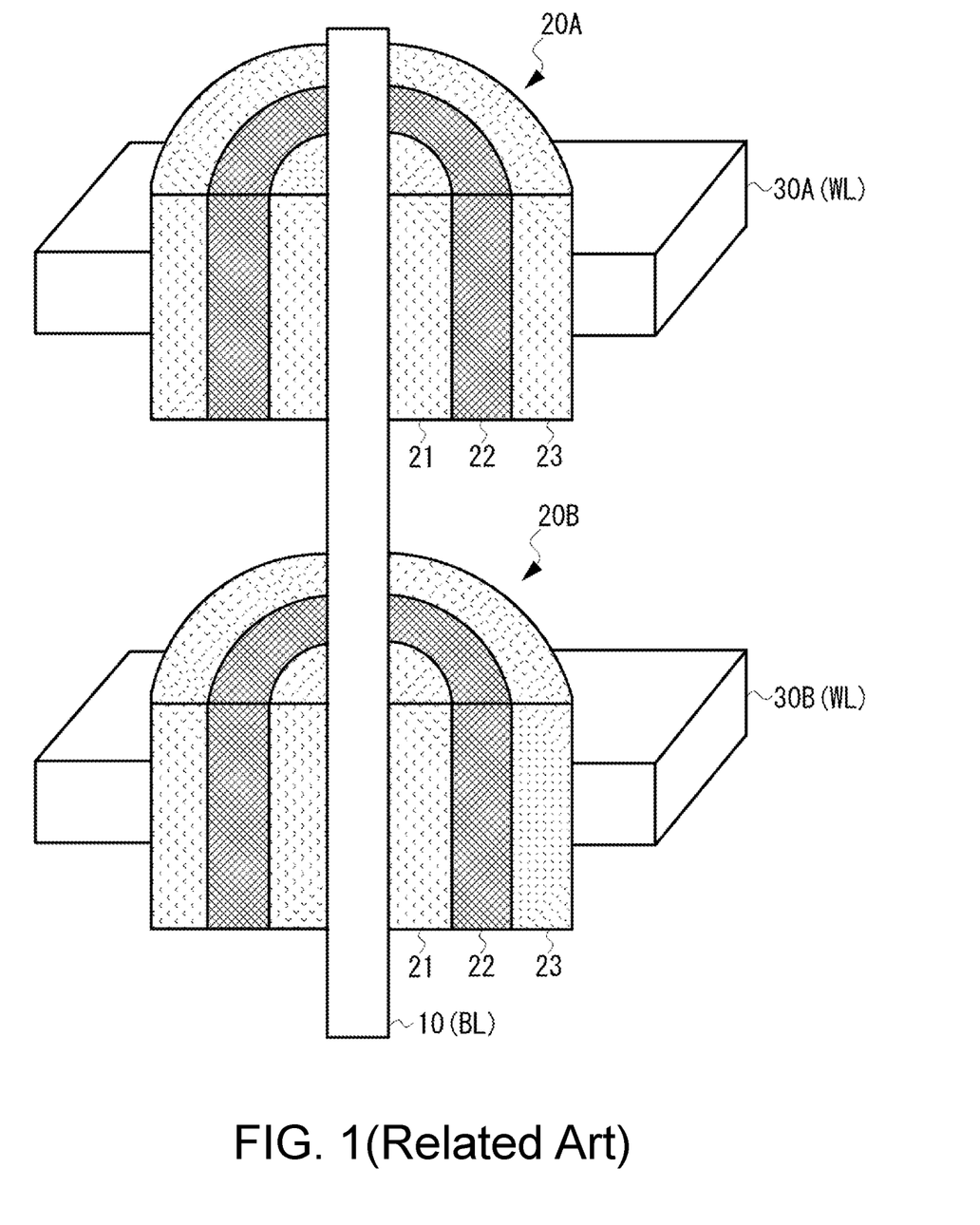
FIG. 1 illustrates a schematic configuration of a conventional resistive random-access memory having a three-dimensional structure.

In a resistive random-access memory (RRAM), a memory cell can be randomly selected in accordance with a row address and a column address, and data can be read from or written to the selected memory cell. A technique for manufacturing a resistive random-access memory using a three-dimensional structure in order to achieve high integration has been disclosed in, for example, US Patent Laid Open No. 2017/0330916. As shown in FIG. 1, a resistive random-access memory of the related art includes a conductive pillar 10 functioning as a bit line and extending in a vertical direction, a word line 30A and a word line 30B extending in a horizontal direction, and a resistive memory element 20A and a resistive memory element 20B of a complementary type formed respectively at an intersection of the pillar 10 and the word line 30A and an intersection of the pillar 10 and the word line 30B. The resistive memory elements 20A and 20B of the complementary type each include a first semiconductor oxide film 21, a conductive film 22 as an intermediate electrode, and a second semiconductor oxide film 23. The resistive memory elements 20A and 20B of the complementary type are physically separated from each other, thereby suppressing the occurrence of an undesired sneak current between the memory elements. In order to maintain reliability of a variable resistance element, these semiconductor oxide films must be formed uniformly with a fixed film thickness and with good reproducibility. However, manufacturing steps for this purpose are not easy to perform; as a result, there is a concern that the manufacturing cost may increase or the yield may decrease.

The disclosure provides a resistive random-access memory device having an improved three-dimensional structure.

SUMMARY

A random-access memory device of the disclosure includes: multiple vertical members, extending in a vertical direction with respect to a main surface of a substrate and including a first conductivity type semiconductor material; multiple horizontal members, extending in a horizontal direction with respect to the main surface of the substrate and including a semiconductive material; and a memory cell, formed at each intersection of the vertical members and the horizontal members. The memory cell includes a gate insulating film formed on an outer periphery of the vertical members, a semiconductor film formed on an outer periphery of the gate insulating film and including a second conductivity type semiconductor material, and a variable resistance film formed on a part of an outer periphery of the semiconductor film. An electrode region of an outer periphery of the variable resistance film is connected to one of a pair of horizontal members adjacent to each other, and the semiconductor film is connected to the other of the pair of horizontal members adjacent to each other.

BRIEF DESCRIPTION OF THE DRAWINGS

FIG. 3A and FIG. 3B illustrate a schematic configuration of a part of a memory cell array of a resistive random-access memory according to an embodiment of the disclosure.

DESCRIPTION OF THE EMBODIMENTS

The disclosure provides a resistive random-access memory including a stacked memory cell array (that is, a memory cell array having a three-dimensional structure). The resistive random-access memory of the disclosure is not only capable of randomly accessing a memory cell but also capable of simultaneously accessing multiple memory cells. A memory cell formed with a three-dimensional structure includes an access transistor between a pair of bit lines and a variable resistance element formed on one side of the access transistor. Among the memory cells in a row direction, adjacent memory cells share a bit line therebetween. Memory cell selection is performed so that when one of the memory cells is selected, the other memory cell becomes unselected, and it is prevented that an undesired sneak path is formed in a selected bit line connected to the selected memory cell.

In addition, the memory cell array having a three-dimensional structure of the disclosure can be applied to a crossbar array or a crossbar memory. The crossbar array is used as a device for constituting a neural network as artificial intelligence (AI) hardware.

Figure 2:
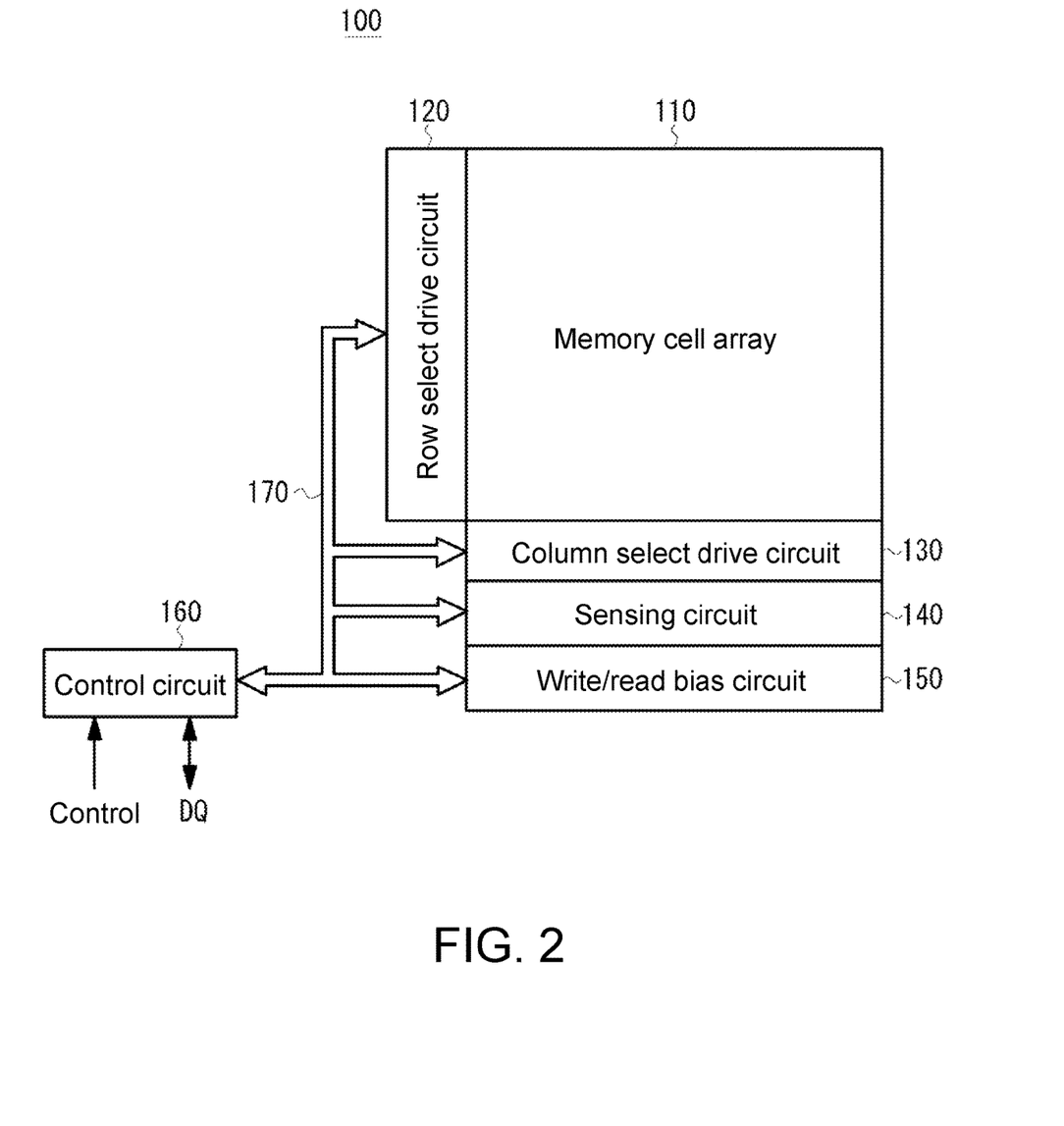
FIG. 2 illustrates an overall configuration of a resistive random-access memory according to an embodiment of the disclosure.

FIG. 2 illustrates an overall configuration of a resistive random-access memory according to the present embodiment. A resistive random-access memory 100 of the present embodiment includes a memory cell array 110 having a three-dimensional structure, a row select drive circuit 120, a column select drive circuit 130, a sensing circuit 140, a write/read bias circuit 150, a control circuit 160, and an internal data bus 170 connecting each part.

Figure 3A:
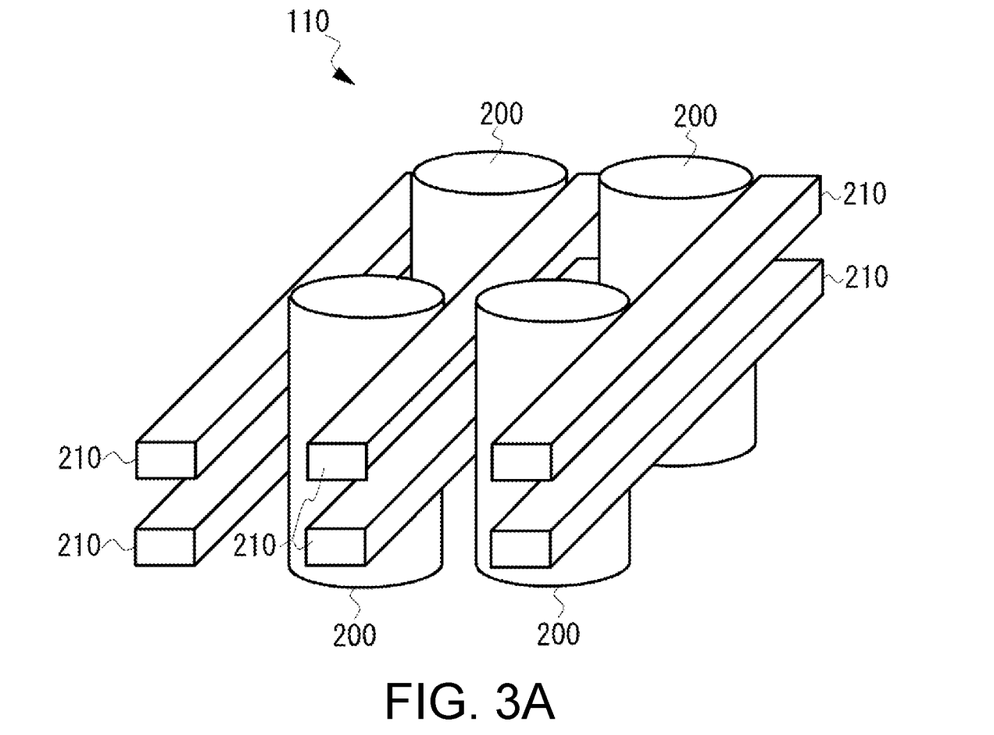
FIG. 3A is a perspective view.
Figure 3B:
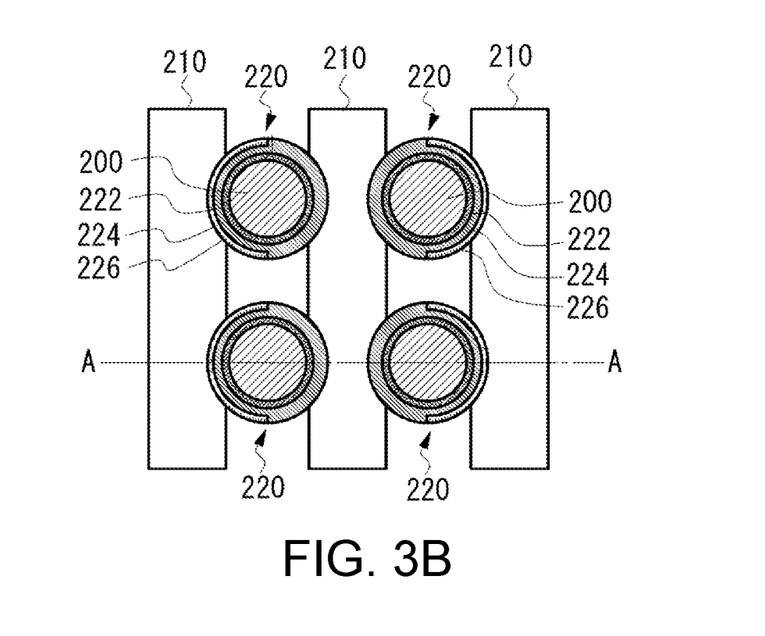
FIG. 3B is a plan view.

FIG. 3A is a perspective view schematically showing a part of the memory cell array 110 of the present embodiment, and FIG. 3B is a schematic plan view of the same. Four memory cells are exemplarily illustrated. The memory cell array 110 includes: multiple pillars 200 (four pillars are shown), extending in a vertical direction with respect to a main surface of a substrate (for example, silicon substrate) (not shown); multiple bit lines 210 (six bit lines are shown), extending in a horizontal direction with respect to the main surface of the substrate and intersecting the pillars 200; and a resistive random-access memory cell 220, formed at an intersection of the pillars 200 and the bit lines 210.

The pillar 200 includes, for example, an N-type polysilicon material, and are electrically connected to corresponding word lines. As shown in FIG. 3B, a gate insulating film 222 (for example, silicon oxide film) is formed with a fixed thickness over an entire outer periphery of the pillar 200, and a semiconductor film 224 including a P-type polysilicon material is formed over an entire outer periphery of the gate insulating film 222. The semiconductor film 224 functions as a channel region of an access transistor and forms an inversion layer when an electric field is applied from the pillar 200. A variable resistance element 226 is formed on a part of an outer periphery of the semiconductor film 224. The variable resistance element 226 is formed in a fan shape so as to cover a part of the semiconductor film 224. In the example shown in the figures, the variable resistance element 226 is formed so as to cover about half of the periphery of the semiconductor film 224. The variable resistance element 226 includes an inner electrode layer, an outer electrode layer, and a switching layer formed between the inner electrode layer and the outer electrode layer. A material of the switching layer includes a metal oxide such as $HfO_2$.

Figure 4:
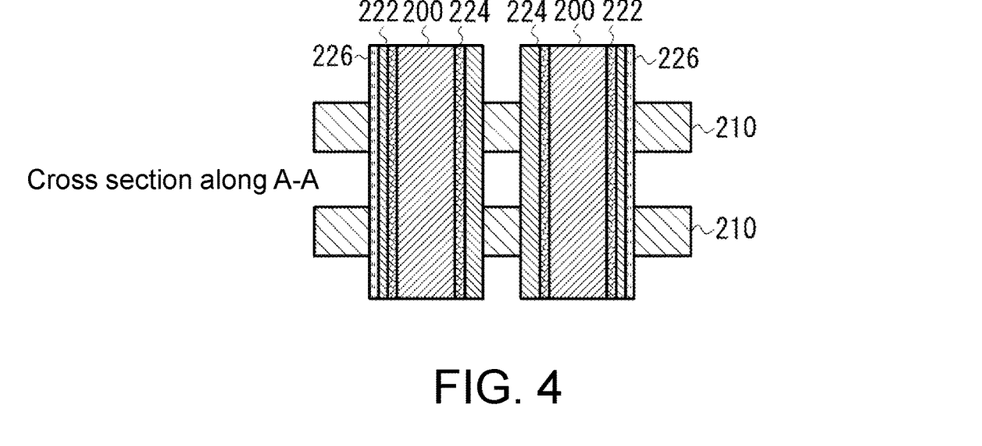
FIG. 4 is a schematic cross-sectional view along line A-A of FIG. 3B.

The bit line 210 includes, for example, an N-type polysilicon material. At the intersection with the pillar 200, one bit line 210 is electrically connected to the outer electrode layer of the variable resistance element 226, and the other bit line 210 is connected to the semiconductor film 224 not covered by the variable resistance element 226. FIG. 4 is a cross-sectional view of the memory cell array of FIG. 3B along line A-A.

Figure 5A:
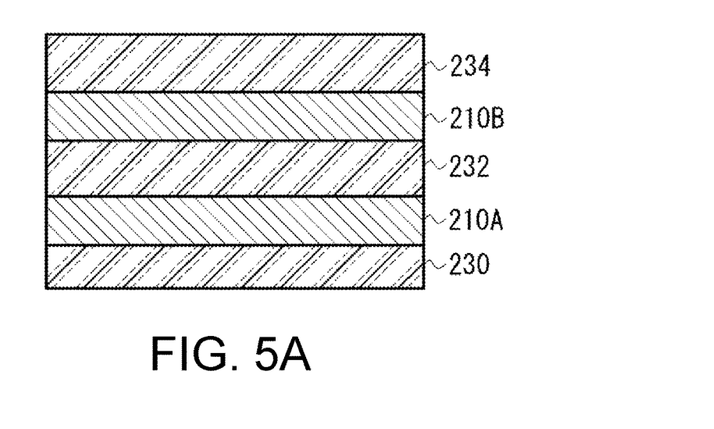
FIG. 5A to FIG. 5J illustrate manufacturing steps of a memory cell array of the present embodiment.

One example of a method for manufacturing the memory cell shown in FIG. 3A and FIG. 3B is described with reference to FIG. 5A to FIG. 5J. Firstly, as shown in FIG. 5A, an interlayer insulating film 230, a bit line 210A on a lower side, an interlayer insulating film 232, a bit line 210B on an upper side, and an interlayer insulating film 234 are sequentially formed on a substrate (not shown). The bit lines 210A and 210B are N+ polysilicon layers. The interlayer insulating films 230, 232 and 234 are, for example, silicon oxide films or silicon nitride films.

Figure 5B:
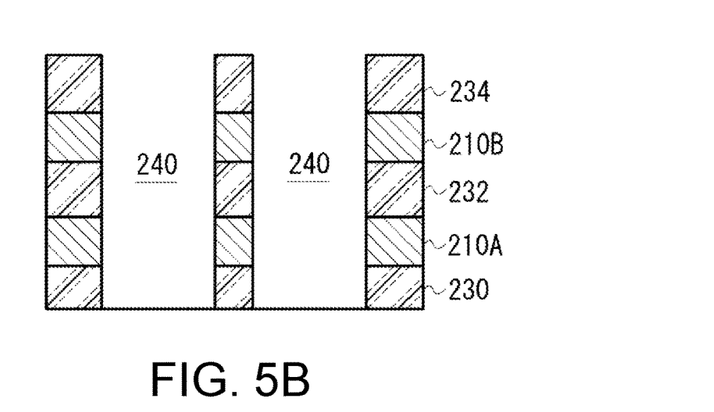

Next, a mask layer (not shown) is formed on the interlayer insulating film 234 by lithography. The shape and size of the mask layer define an outer shape of the pillar 200. For example, if the pillar 200 has a columnar shape, a circular opening pattern is formed in a portion of the mask layer where the pillar 200 is to be formed. By performing anisotropic etching using the mask layer on the interlayer insulating films 230, 232 and 234 and the bit lines 210A and 210B that are laminated together, an opening 240 having a cylindrical shape as shown in FIG. 5B is formed.

Figure 5C:
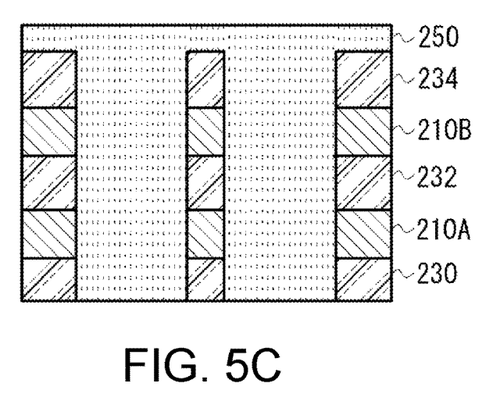
Figure 5D:
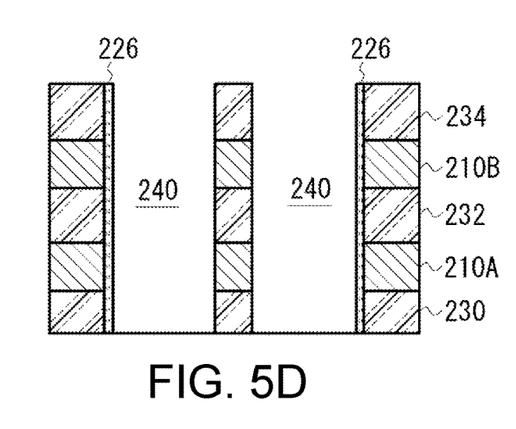

Next, the mask layer is removed, and a material layer 250 of a variable resistance element is formed on the entire surface, as shown in FIG. 5C. The material layer 250 includes a laminate of the outer electrode layer, the switching layer (for example, hafnium oxide (HfOx)), and the inner electrode layer. Next, a mask layer (not shown) is formed, anisotropic etching and/or isotropic etching is performed on the material layer 250 using this mask layer, and the variable resistance element 226 is formed on a part (for example, half of the periphery of the opening 240) of a sidewall of the opening 240, as shown in FIG. 5D.

Figure 5E:
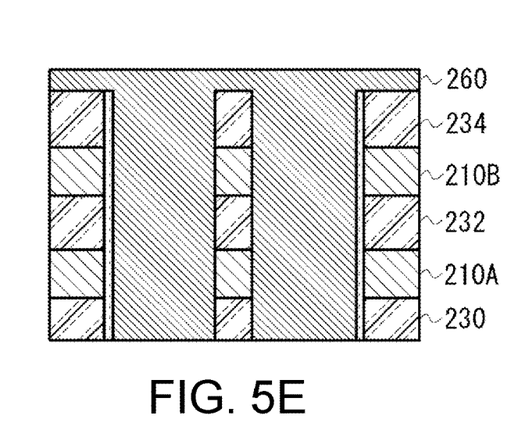
Figure 5F:
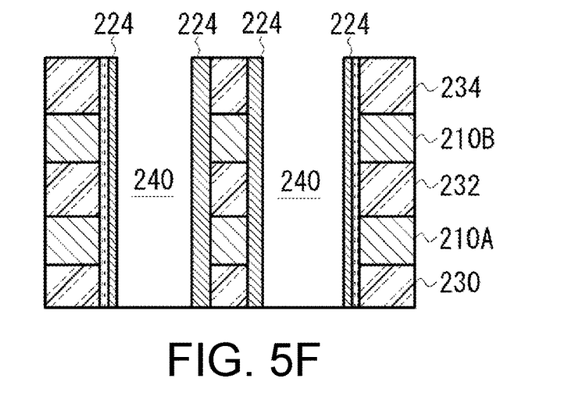

Next, the mask layer is removed, and a P+ polysilicon material 260 is formed on the entire surface, as shown in FIG. 5E. Next, a mask layer (not shown) is formed, anisotropic etching and/or isotropic etching is performed on the polysilicon material 260 using this mask layer, and the semiconductor film 224 is formed on the sidewall of the opening 240 and inside the variable resistance element 226, as shown in FIG. 5F. Accordingly, the variable resistance element 226 is covered by the semiconductor film 224.

Figure 5G:
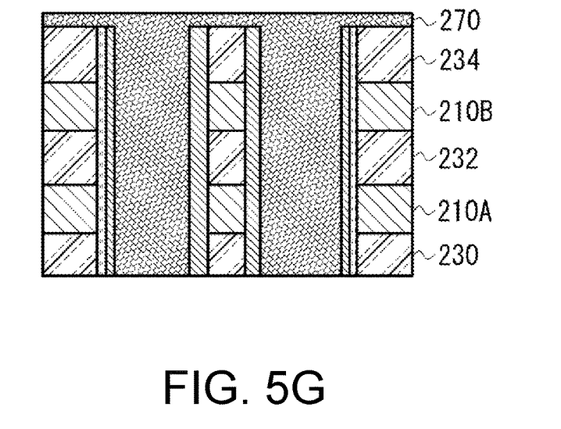
Figure 5H:
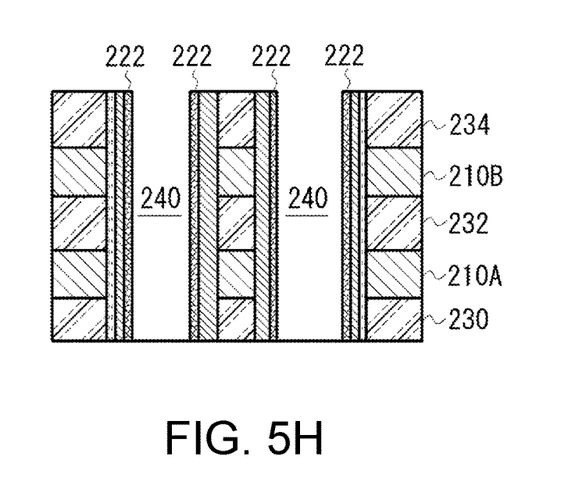

Next, the mask layer is removed, and an insulating material 270 such as $SiO_2$ or the like is formed on the entire surface, as shown in FIG. 5G. Next, a mask layer (not shown) is formed, anisotropic etching and/or isotropic etching is performed on the insulating material 270 using this mask layer, and the gate insulating film 222 is formed on the sidewall of the opening 240 and inside the semiconductor film 224, as shown in FIG. 5H.

Figure 5I:
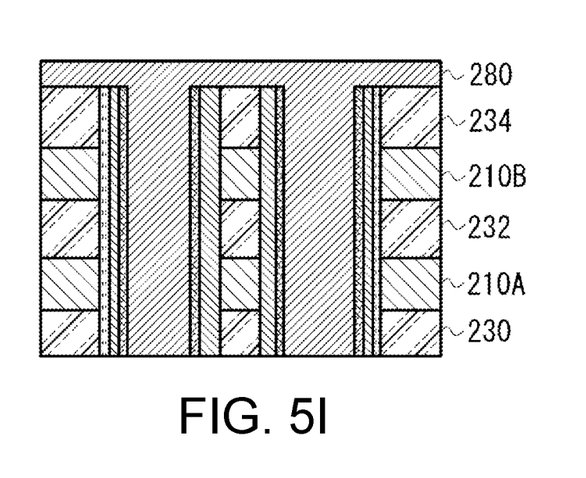
Figure 5J:
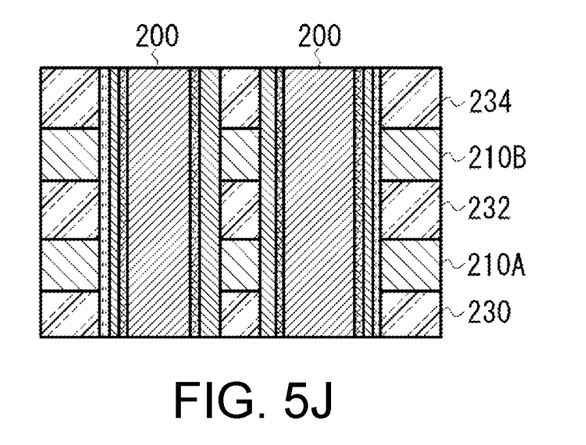

Next, the mask layer is removed, and an N+ polysilicon material 280 is formed on the entire surface, as shown in FIG. 5I. The polysilicon material 280 is etched back or planarized, thereby forming the pillar 200 as shown in FIG. 5J. In addition, in the above manufacturing steps, the bit lines 210A and 210B are formed first and the pillar 200 is subsequently formed. However, the disclosure is not limited thereto. The bit line 210 may be formed after formation of the pillar 200 as well as the gate insulating film 222, the semiconductor film 224 and the variable resistance element 226 that surround the pillar 200. In addition, the memory cell array of the present embodiment is not limited to one manufactured by the above manufacturing method, and may be manufactured using other manufacturing steps.

Referring to FIG. 2 again, The row select drive circuit 120 selects a word line according to a row address from the control circuit 160, and applies a voltage to the selected word line. Multiple word lines extending in the row direction are electrically connected to the corresponding pillars 200. The column select drive circuit 130 selects a bit line according to a column address from the control circuit 160. During a read operation, the sensing circuit 140 senses a current or voltage flowing through a bit line pair of a memory cell selected by the row select drive circuit 120 and the column select drive circuit 130, and outputs data representing a sensing result to the control circuit 160 via the internal data bus 170. During the read operation, the write/read bias circuit 150 applies a bias voltage for the read operation to the bit line pair of the selected memory cell. In addition, during a write operation, the write/read bias circuit 150 applies a set bias or a reset bias to the bit line pair of the selected memory cell according to write data received from the control circuit 160.

The control circuit 160 includes hardware and/or software, and controls the operation of each part. In a certain embodiment, the control circuit 160 includes a microcontroller, microprocessor, or state machine that includes a read-only memory (ROM) or random-access memory (RAM), and controls the read operation, the write operation (set or reset) or the like by, for example, executing software stored in the ROM or RAM. In addition, the control circuit 160 is connected to each part through the internal data bus 170, provides data (including addresses) received from the outside to each part, and outputs the read data received from the sensing circuit 140 to the outside.

Figure 6A:
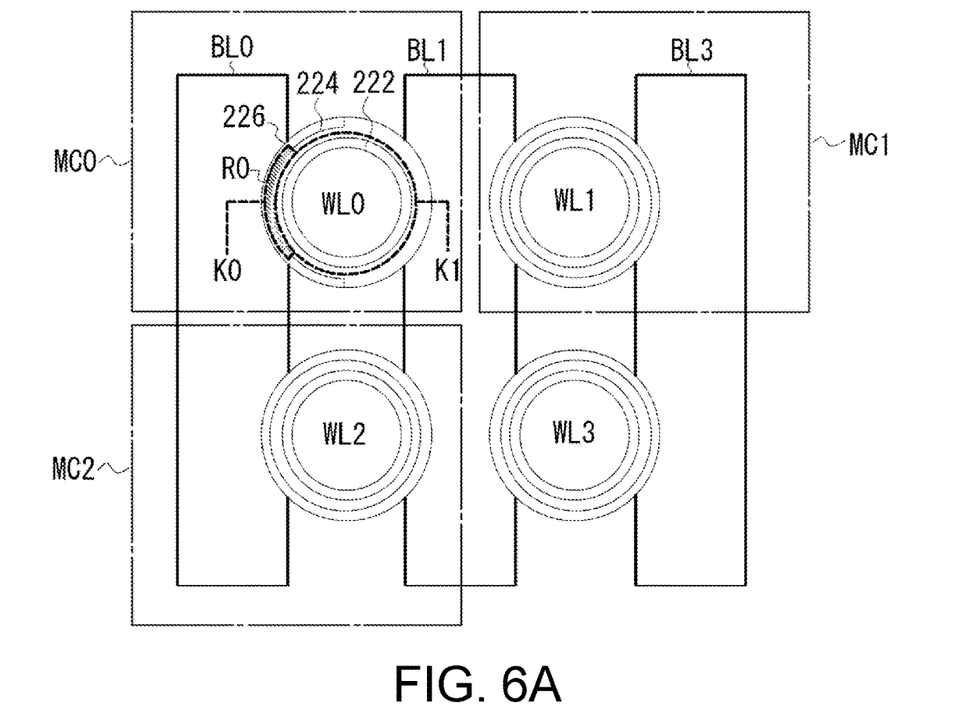
FIG. 6A and FIG. 6B illustrate a connection relationship between an access transistor and a variable resistance element when a memory cell is selected in the present embodiment.
Figure 6B:
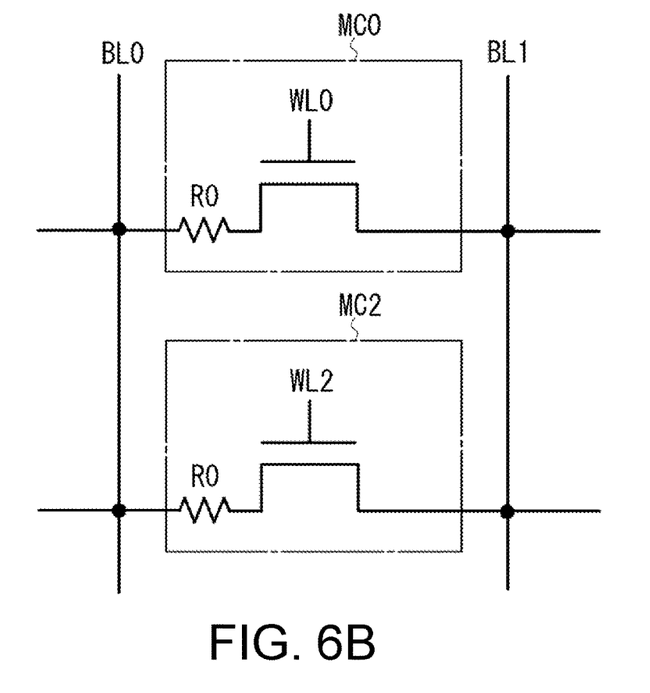

Details of operation of a resistive random-access memory of the present embodiment are described. FIG. 6A and FIG. 6B illustrate a connection relationship between an access transistor and a variable resistance element when a certain memory cell is selected. Here, it is assumed that a word line WL0 connected to the pillar 200 of a memory cell MC0 is selected by the row select drive circuit 120, and a bit line pair BL0/BL1 is selected by the column select drive circuit 130. When a certain positive voltage is applied to the word line WL0, an electric field is applied to the semiconductor film 224 via the gate insulating film 222, the entire semiconductor film 224 is inverted into the N-type, and a channel region is formed. As a result, the semiconductor film 224 is electrically connected to the bit line BL0 via an electrode region outside the variable resistance element 226, and the channel region that has been inverted into the N-type is electrically connected to the bit line BL1 as the N-type polysilicon layer in a region facing the electrode region of the variable resistance element 226.

On a current path K0 between the bit line BL0 and the semiconductor film 224, a resistance component R0 formed by the variable resistance element 226 is formed. A current path K1 between the bit line BL1 and the semiconductor film 224 is a low resistance region formed by N-type polysilicon. FIG. 6B is an equivalent circuit diagram of FIG. 6A. In the selected memory cell MC0, a one-resistor, one-transistor (1R1T) memory cell is formed in which one access transistor is included between a pair of bit lines BL0/BL1, and the resistance component R0 is included in one of the pair of bit lines BL0/BL1.

A memory cell MC1 adjacent to the selected memory cell MC0 in the row direction shares the bit line BL1 with the selected memory cell MC0, while a word line WL1 is not selected (a GND potential or a voltage lower than a threshold is applied to the word line WL1). No inversion layer is formed in the semiconductor film 224, and an access transistor of the memory cell MC1 remains off. Therefore, the bit line BL1 is actually isolated from the unselected memory cell MC1 and the formation of a sneak current path is avoided.

In addition, a memory cell MC2 adjacent to the selected memory cell MC0 in a column direction shares the bit line pair BL0/BL1 with the selected memory cell MC0, while a word line WL2 is unselected. A PN barrier is formed between the bit line pair BL0/BL1 and the semiconductor film 224, and an access transistor remains off. Therefore, the bit line pair BL0/BL1 is actually isolated from the unselected memory cell MC2 (and also the other unselected memory cells that share the bit line pair BL0/BL1 in the column direction), and the formation of sneak current paths is avoided.

A write operation on the selected memory cell MC0 is described. The write/read bias circuit 150 performs set writing or reset writing on the selected memory cell MC0 according to the write data from the control circuit 160. In the set writing, the row select drive circuit 120 applies a write voltage Vset to the selected word line WL0 and applies GND to an unselected word line. The write/read bias circuit 150 applies a set write voltage Vs (Vset>Vs) to one selected bit line BL0, and applies GND to the other selected bit line BL1. Accordingly, a voltage is applied from the bit line BL0 to the bit line BL1, and the variable resistance element 226, that is, the resistance component R0 on the current path K0, is programmed into a low resistance state.

In the reset writing, a voltage having a different polarity from that in the set writing is applied to the bit line pair BL0/BL1. That is, the row select drive circuit 120 applies a write voltage Vrset to the selected word line WL0 and applies GND to an unselected word line. The write/read bias circuit 150 applies GND to one selected bit line BL0, and applies a reset write voltage Vr (Vrset>Vr) to the other selected bit line BL1. Accordingly, a voltage is applied from the bit line BL1 to the bit line BL0, and the variable resistance element 226, that is, the resistance component R0 on the current path K0, is programmed into a high resistance state.

In the read operation on the selected memory cell MC0, the row select drive circuit 120 applies a read voltage Vread to the selected word line WL0, and applies GND to an unselected word line. The write/read bias circuit 150 applies a read voltage Vb1 to one selected bit line BL0, and applies GND to the other selected bit line BL1. If the variable resistance element 226 is in the low resistance state (set), a large current flows from the selected bit line BL0 to the selected bit line BL1; if the variable resistance element 226 is in the high resistance state (reset), a small current flows from the selected bit line BL0 to the selected bit line BL1. The sensing circuit 140 senses a current or voltage between the selected bit line pair BL0/BL1, and outputs, as the read data, data "0" and data "1" corresponding to a sensing result, to the control circuit 160 via the internal data bus 170.

In the above embodiment, the variable resistance element 226 is formed in a substantially semicircular shape. However, this is only an example, and the variable resistance element 226 may have any shape as long as it at least includes a region in electrical contact with the bit line BL0. In addition, in the above embodiment, the variable resistance element 226 is connected to the bit line BL0, and the semiconductor film 224 is connected to the bit line BL1. However, this is only an example, and the semiconductor film 224 may be connected to the bit line BL0, and the variable resistance element 226 may be connected to the bit line BL1.

A second embodiment of the disclosure is described. The above embodiment shows an example of randomly accessing one memory cell, and the second embodiment relates to an array configuration in which multiple memory cells can be simultaneously accessed. Such array configuration is suitable for a so-called crossbar array.

Figure 7A:
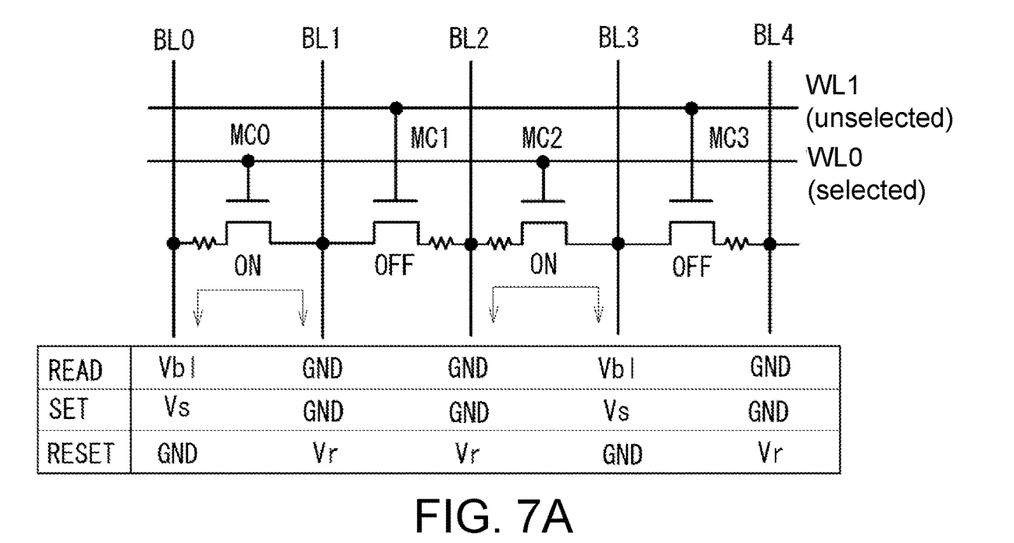
FIG. 7A and FIG. 7B illustrate a configuration of a memory cell array according to a second embodiment of the disclosure.
Figure 7B:
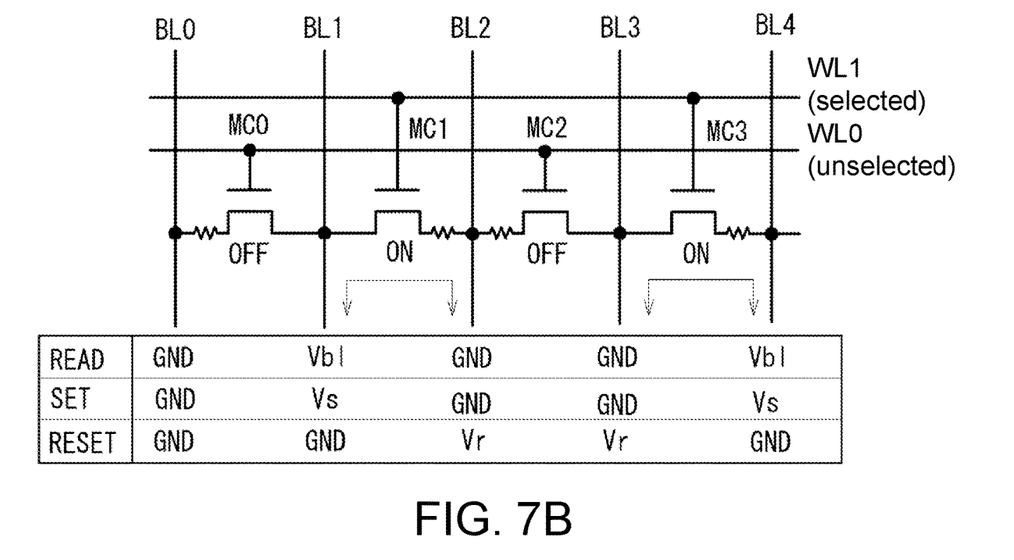

FIG. 7A and FIG. 7B illustrate a circuit configuration of a part of a memory cell array of the second embodiment. The memory cells MC0 to MC3 arranged in the row direction are alternately connected to the word lines WL0 and WL1. As shown in FIG. 7A, when the word line WL0 is selected, the access transistors of the memory cells MC0 and MC2 are turned on (that is, an inversion layer is formed in the semiconductor film 224). On the other hand, as shown in FIG. 7B, when the word line WL1 is selected, the access transistors of the memory cells MC1 and MC3 are turned on. The write/read bias circuit 150 applies the read voltage Vb1, the set write voltage Vs and the reset write voltage Vr to one bit line in a selected bit line pair, and makes the other bit line virtually grounded.

When one word line is selected by the row select drive circuit 120, the access transistors of multiple memory cells connected to the selected word line are simultaneously turned on, and multiple data stored in the multiple memory cells can be collectively read, or multiple data can be collectively written to the multiple memory cells. Such input and output of multiple data can be used in, for example, a matrix operation of a crossbar array.

Even if a bit line is shared between adjacent memory cells in the row direction, since an unselected memory cell is present between selected memory cells, and the access transistor of the unselected memory cell is turned off, the bit line pair of the selected memory cell is not interfered by the unselected memory cell, and a desired bias can be applied. In addition, although omitted from illustration, the access transistor of the unselected memory cell that shares the bit line with the selected memory cell in the column direction is also turned off. Therefore, the selected bit line pair of the selected memory cell is not interfered by the unselected memory cell, and the formation of an undesired sneak current path is suppressed.

Figure 8:
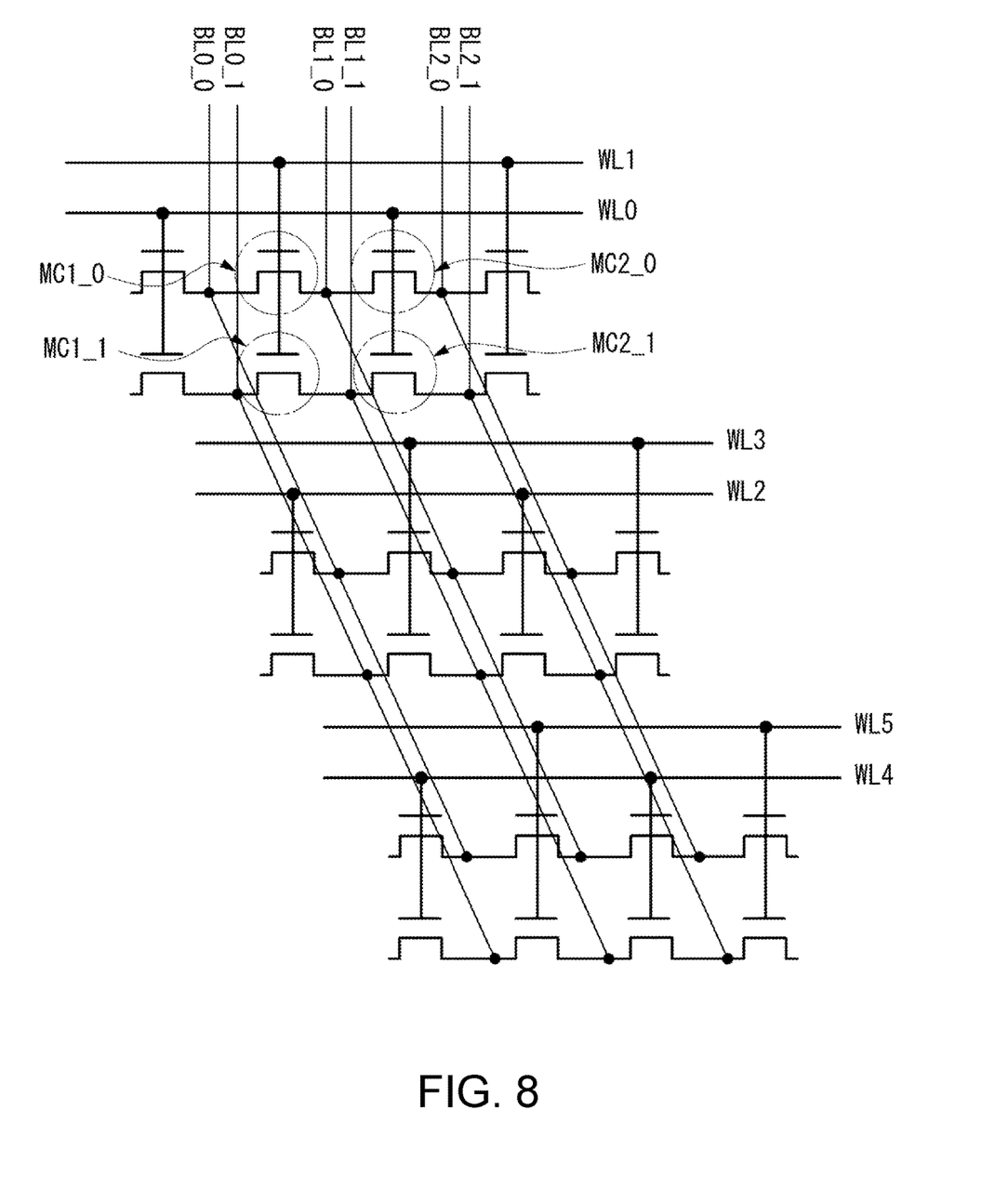
FIG. 8 schematically illustrates a three-dimensional structure of the memory cell array according to the second embodiment of the disclosure.

FIG. 8 is a three-dimensional view of the array configuration shown in FIG. 7A and FIG. 7B. Here, two sections of bit lines stacked in the vertical direction are shown. The basic operation of the array is the same as in FIG. 7A and FIG. 7B. When a memory cell MC2_0 and a memory cell MC2_1 are selected by the selected word line WL0, access transistors of the memory cells MC2_0 and MC2_1 are turned on, and a bit line pair BL1_0/BL2_0 and a bit line pair BL1_1/BL2_1 are selected. When a memory cell MC1_0 and a memory cell MC1_1 are selected by the selected word line WL1, access transistors of the memory cells MC1_0 and MC1_1 are turned on, and a bit line pair BL0_0/BL1_0 and a bit line pair BL0_1/BL1_1 are selected.

Figure 9:
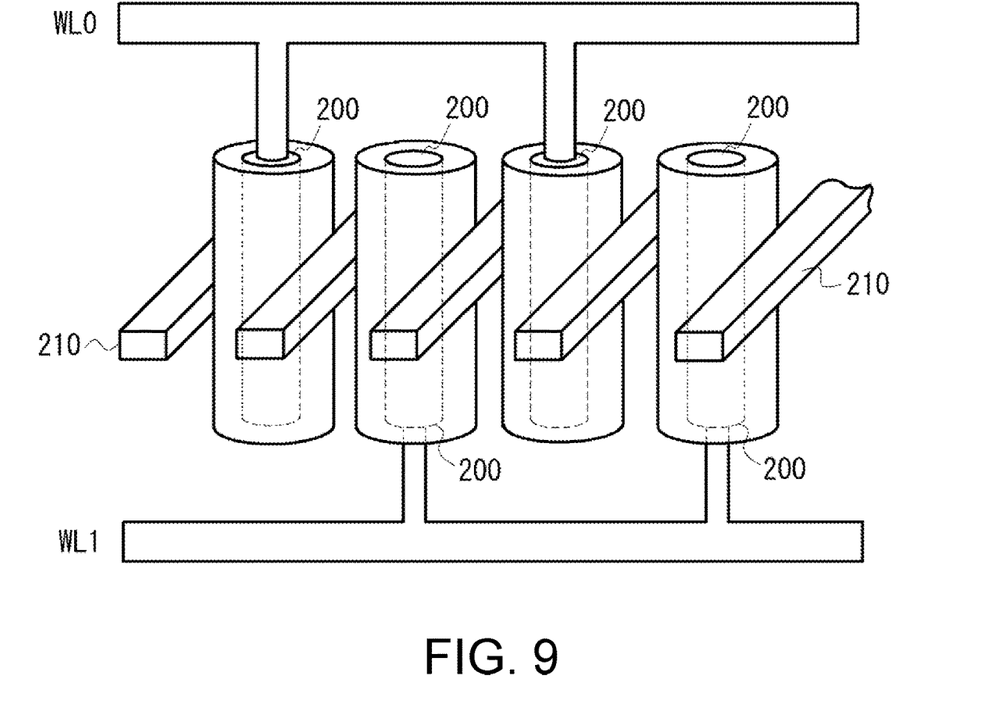
FIG. 9 illustrates an example of connection between a pillar and a word line according to the second embodiment of the disclosure.

FIG. 9 is a schematic perspective view showing a preferred example of connection between a pillar and a word line of a memory cell array. The word line WL0 is connected to an upper end of every other one of the pillars 200 arranged in the row direction, and the word line WL1 is connected to a lower end of every other one of the pillars 200 not connected to the word line WL0. The word lines WL0 and WL1 may be conductive polysilicon or metal layers. By connecting the pillars 200 to the word lines WL0 and WL1 alternately from the vertical direction of the pillars 200, the integration of the memory cell array can be increased and the area occupied by the memory cell array in the horizontal direction can be reduced as compared to the case where the word lines WL0 and WL1 are wired on the same plane.

Figure 10:
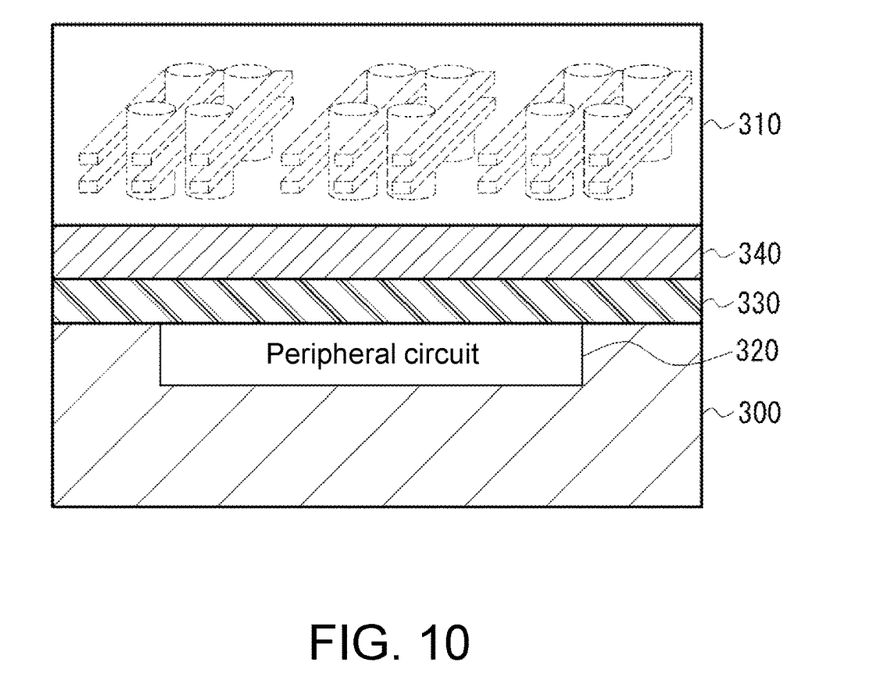
FIG. 10 is a schematic cross-sectional view showing an example in which a three-dimensional structure of a memory cell array according to an embodiment of the disclosure is laminated on a substrate.

FIG. 10 is a schematic cross-sectional view showing an example in which a memory cell array of the present embodiment is laminated on a substrate. A silicon substrate 300, for example, is used as the substrate, and a memory cell array 310 having a three-dimensional structure is formed on the silicon substrate 300. A peripheral circuit 320 such as the row select drive circuit 120, the column select drive circuit 130, the sensing circuit 140, the write/read bias circuit 150 and the control circuit 160 is formed on a surface of or inside the silicon substrate 300. The selected pillar 200, the selected bit line 210 and the selected word line or the like of the memory cell array 310 are electrically connected to the row select drive circuit 120, the column select drive circuit 130, the sensing circuit 140, the write/read bias circuit 150 and the control circuit 160 of the peripheral circuit 320 via a multilayer wiring structure. The multilayer wiring structure includes multiple conductive layers (polysilicon layers and metal layers), multiple interlayer insulating films, a via (or contact hole) formed in the interlayer insulating films, a plug contact formed in the via, and the like, and enables electrical connection of bit lines or word lines laminated in the vertical direction with the peripheral circuit 320.

In a certain embodiment, an insulating layer 330 is formed on the silicon substrate 300, a conductive layer 340 is formed on the insulating layer 330, and the memory cell array 310 is formed on the conductive layer 340. The conductive layer 340 provides, for example, a common source (GND potential) or power supply line of the memory cell array 310. The conductive layer 340 includes, for example, an N-type polysilicon layer, or a laminate of a metal layer and an N-type polysilicon layer. By forming the peripheral circuit 320 on the silicon substrate 300 and laminating the memory cell array 310 thereabove, two-dimensional area of a memory chip can be reduced.

A random-access memory device of the disclosure includes: multiple vertical members, extending in a vertical direction with respect to a main surface of a substrate and including a first conductivity type semiconductor material; multiple horizontal members, extending in a horizontal direction with respect to the main surface of the substrate and including a semiconductive material; and a memory cell, formed at each intersection of the vertical members and the horizontal members. The memory cell includes a gate insulating film formed on an outer periphery of the vertical members, a semiconductor film formed on an outer periphery of the gate insulating film and including a second conductivity type semiconductor material, and a variable resistance film formed on a part of an outer periphery of the semiconductor film. An electrode region of an outer periphery of the variable resistance film is connected to one of a pair of horizontal members adjacent to each other, and the semiconductor film is connected to the other of the pair of horizontal members adjacent to each other.

According to the disclosure, the memory cell is formed at each intersection of the vertical members and the horizontal members. The memory cell is formed so that the electrode region of the outer periphery of the variable resistance film is connected to one horizontal member, and the semiconductor film is connected to the other horizontal member.

Accordingly, a random-access memory device can be provided in which the three-dimensional structure of the memory cell array is simplified and the manufacturing steps are simplified.

Although the embodiments of the disclosure have been described in detail, the disclosure is not limited to specific embodiments, and may be modified or altered within the scope of the gist of the disclosure as defined in the appended claims.

What is claimed is:

1. A resistive random-access memory device comprising:
   a plurality of vertical members, extending in a vertical direction with respect to a main surface of a substrate and comprising a first conductivity type semiconductor material;
   a plurality of horizontal members, extending in a horizontal direction with respect to the main surface of the substrate and comprising a semiconductive material; and
   a memory cell, formed at each intersection of the plurality of vertical members and the plurality of horizontal members, wherein
   the memory cell comprises a gate insulating film formed on an outer periphery of the plurality of vertical members, a semiconductor film formed on an outer periphery of the gate insulating film and comprising a second conductivity type semiconductor material, and a variable resistance film formed on a part of an outer periphery of the semiconductor film, wherein an electrode region of an outer periphery of the variable resistance film is connected to one of a pair of horizontal members adjacent to each other, and the semiconductor film is connected to the other of the pair of horizontal members.

2. The random-access memory device according to claim 1, wherein when a voltage is applied to the semiconductor film from the plurality of vertical members via the gate insulating film, a channel is formed in the semiconductor film, and the pair of horizontal members is electrically connected via the electrode region and the channel.

3. The random-access memory device according to claim 1, wherein the plurality of vertical members, the plurality of horizontal members, and the semiconductor film comprise a polysilicon material.

4. The random-access memory device according to claim 1, wherein the plurality of vertical members are arranged in a two-dimensional manner, the plurality of horizontal members are arranged in the vertical direction, and a plurality of the memory cells are arranged in a three-dimensional manner.

5. The random-access memory device according to claim 1, further comprising:
a row select part, selecting the vertical member according to a row address signal;
a column select part, selecting the horizontal member according to a column address signal; and
a control part, controlling reading or writing on a memory cell selected by the row select part and the column select part, wherein
the control part applies a read voltage or a write voltage to one of the pair of horizontal members connected to the selected memory cell, and applies a reference voltage or ground to the other of the pair of horizontal members connected to the selected memory cell.

6. The random-access memory device according to claim 5, wherein the memory cell is randomly selected by the row select part and the column select part.

7. The random-access memory device according to claim 5, wherein the plurality of vertical members are connected to corresponding word lines, and the plurality of horizontal members are connected to corresponding bit lines,
the row select part selects a word line, and the column select part selects a bit line, thereby selecting the memory cell.

8. The random-access memory device according to claim 7, wherein one end of an odd-numbered vertical member in a row direction is electrically connected to a first word line extending in the horizontal direction, the other end of an even-numbered vertical member in the row direction facing the one end is electrically connected to a second word line extending in the horizontal direction.

9. The random-access memory device according to claim 7, wherein the memory cells in a row direction share a bit line, a plurality of the memory cells in the same row comprise a first group of memory cells and a second group of memory cells, and the first group of memory cells and the second group of memory cells are alternately arranged,
the first group of memory cells are electrically connected to a first word line, and the second group of memory cells are connected to a second word line,
when the first group of memory cells are selected, the second group of memory cells are unselected, and when the second group of memory cells are selected, the first group of memory cells are unselected.

10. The random-access memory device according to claim 9, wherein the control part applies a bias voltage for reading or writing to a selected bit line pair connected to the selected first group of memory cells or the selected second group of memory cells.

11. The random-access memory device according to claim 1, further comprising the substrate, and a peripheral circuit formed on a surface of or inside the substrate, wherein
the plurality of vertical members and the plurality of horizontal members are formed on the peripheral circuit, and
the plurality of vertical members and the plurality of horizontal members are electrically connected to the peripheral circuit via a multilayer wiring structure.

12. The random-access memory device according to claim 11, wherein the multilayer wiring structure comprises a laminate of a plurality of conductive layers and a plurality of insulating layers, and a selected conductive layer is connected to a selected vertical member or horizontal member.

13. The random-access memory device according to claim 11, wherein the peripheral circuit comprises a row select circuit selecting the vertical member according to a row address signal and a column select circuit selecting the horizontal member according to a column address signal.

14. The random-access memory device according to claim 1, wherein the variable resistance film comprises an inner electrode layer, an outer electrode layer, and a switching layer formed between the inner electrode layer and the outer electrode layer, and a material of the switching layer comprises a metal oxide.

15. The random-access memory device according to claim 1, wherein the plurality of vertical members have a columnar shape, and the variable resistance film is formed in a substantially semicircular shape.

16. A method for manufacturing a resistive random-access memory device, adapted to manufacture the resistive random-access memory device according to claim 1 and comprising:
preparing the substrate on which the plurality of horizontal members and an interlayer insulating film electrically insulated from each of the plurality of horizontal members are formed,
forming an opening penetrating the plurality of horizontal members and the interlayer insulating film,
forming the variable resistance film on a part of a sidewall of the opening,
forming the semiconductor film on the sidewall of the opening that comprises the variable resistance film,
forming the gate insulating film in an opening of the semiconductor film, and
forming the plurality of vertical members in an opening of the gate insulating film.

17. The method for manufacturing a resistive random-access memory device according to claim 16, wherein the resistive random-access memory further comprises:
a row select part, selecting the vertical member according to a row address signal;
a column select part, selecting the horizontal member according to a column address signal; and
a control part, controlling reading or writing on a memory cell selected by the row select part and the column select part, wherein the substrate comprises a silicon substrate and an insulating layer, and wherein the method further comprises:

forming a peripheral circuit of the row select part, the column select part and the control part on a surface of the silicon substrate, and forming the plurality of horizontal members, the plurality of vertical members and the memory cell comprising the variable resistance film on the insulating layer.

* * * * *